(12) United States Patent
Roubadia et al.

(10) Patent No.: US 10,860,049 B2
(45) Date of Patent: Dec. 8, 2020

(54) CIRCUIT FOR THE GENERATION OF NON-OVERLAPPING CONTROL SIGNALS

(71) Applicant: STMicroelectronics (Rousset) SAS, Rousset (FR)

(72) Inventors: Regis Roubadia, Les Pennes Mirabeau (FR); Ludovic Girardeau, Pourrières (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/594,405

(22) Filed: Oct. 7, 2019

(65) Prior Publication Data
US 2020/0110434 A1 Apr. 9, 2020

(30) Foreign Application Priority Data
Oct. 9, 2018 (FR) ...................................... 18 59333

(51) Int. Cl.
*H04W 4/40* (2018.01)
*G06F 1/025* (2006.01)
*H03K 19/0185* (2006.01)

(52) U.S. Cl.
CPC ..... *G06F 1/025* (2013.01); *H03K 19/018571* (2013.01); *H04W 4/40* (2018.02)

(58) Field of Classification Search
USPC .......................................... 330/253; 327/112
See application file for complete search history.

(56) References Cited

U.S. PATENT DOCUMENTS

| | | | | |
|---|---|---|---|---|
| 5,343,766 A * | 9/1994 | Lee | ....................... | G01D 5/2417 73/514.18 |
| 6,339,348 B1 | 1/2002 | Fisher | | |
| 9,136,760 B2 * | 9/2015 | Wismar | ................. | H02M 3/157 |
| 10,193,448 B1 * | 1/2019 | Crawley | ................ | H02M 3/158 |
| 2001/0035743 A1 | 11/2001 | Feldtkeller | | |
| 2005/0093586 A1 * | 5/2005 | Karlsson | ............... | H03F 3/2171 327/112 |
| 2011/0148523 A1 * | 6/2011 | Deng | ...................... | H03F 3/005 330/253 |
| 2014/0035625 A1 | 2/2014 | Hafizi et al. | | |
| 2014/0139160 A1 | 5/2014 | Hattori | | |
| 2016/0241180 A1 | 8/2016 | Suzuki | | |
| 2018/0062643 A1 | 3/2018 | Trescases et al. | | |

FOREIGN PATENT DOCUMENTS

EP 2521263 A1 11/2012

OTHER PUBLICATIONS

INPI Search Report and Written Opinion for FR 1859333 dated Jun. 25, 2019 (9 pages).

* cited by examiner

*Primary Examiner* — Eva Y Puente
(74) *Attorney, Agent, or Firm* — Crowe & Dunlevy (57) ABSTRACT

A signal generation circuit generates first and second non-overlapping digital signals from an input pulse signal. A first digital circuit includes: a first logical OR gate receiving the second digital signal and the input pulse signal to generate a third digital signal; and a second logical OR gate receiving the input pulse signal and a delayed version of the third digital signal to generate the first digital signal. A second digital circuit includes: a first logical AND gate receiving the first digital signal and the input pulse signal to generate a fourth digital signal; and a second logical AND gate receiving the input pulse signal and the fourth digital signal to generate the second digital signal.

30 Claims, 5 Drawing Sheets

CIRCUIT FOR THE GENERATION OF NON-OVERLAPPING CONTROL SIGNALS

PRIORITY CLAIM

This application claims the priority benefit of French Application for Patent No. 1859333, filed on Oct. 9, 2018, the contents of which are hereby incorporated by reference in their entirety to the maximum extent allowable by law.

TECHNICAL FIELD

The present disclosure generally concerns an electronic circuit and, in particular, a circuit for the generation of control signals for CMOS circuits. The present disclosure applies, among others, to the generation of pulse-width modulation signals for switched-mode power supplies.

BACKGROUND

The switched-mode power supplies (SMPS) to which the present disclosure relates are well known systems where a DC voltage is cut-off at the rate of a relatively high frequency (generally of a few MHz). The control pulses are pulse-width modulated (PWM), for example, to regulate the output voltage of the power supply.

The pulses are used to control a switch (generally a MOS power transistor) for cutting off the input voltage. A pulse-width modulated signal is generally generated by a comparison between a periodic ramp signal and a reference voltage. This control may transit through a control stage (driver) generally in CMOS technology.

There is a need to improve power switch control circuits, particularly for a switched-mode power supply.

More generally, there is a need to improve circuits of generation of non-overlapping control signals of a circuit of two MOS transistors in series, particularly when the pulse width varies.

SUMMARY

An embodiment aims at decreasing all or part of the disadvantages of known techniques for generating non overlapping signals, particularly for CMOS circuits.

An embodiment provides a signal generation circuit comprising logic functions and delay elements configured to obtain, from a first pulse signal, a second and a third non-overlapping digital signals.

According to an embodiment, each of the second and third signals is obtained by logic combination of the first signal and of delayed information of the other signal among the second and third signals.

According to an embodiment, each of the second and third signals is obtained from at least one OR-type logic function or at least one AND-type logic function and at least one delay element.

According to an embodiment, the circuit comprises: a first logic OR-type function for supplying the second signal and taking into account the first signal and delayed information of the third signal; and a first AND-type logic function for supplying the third signal and taking into account the first signal and delayed information of the second signal.

According to an embodiment, the circuit further comprises: a second AND-type logic function taking into account the first and second signals and an element for delaying the result of this function, supplying said delayed information of the second signal; and a second OR-type logic function taking into account the first and third signals and an element for delaying the result of this function, supplying said delayed information of the third signal.

According to an embodiment, the circuit comprises: a first terminal configured to receive the first signal; a first OR-type logic function having a first input coupled to the first terminal and having an output coupled to a second terminal configured to supply the second signal; a first AND-type logic function having a first input coupled to the first terminal and having an output coupled to a third terminal configured to supply the third signal; a second AND-type logic function having a first input coupled to the first terminal, having a second input coupled to the second terminal and having an output coupled, via a first delay element, to the second input of the first AND-type logic function; and a second OR-type logic function having a first input coupled to the first terminal, having a second input coupled to the third terminal, and having an output coupled, via a second delay element, to the second input of the first OR-type logic function.

According to an embodiment, the first signal is a pulse-width modulated signal.

According to an embodiment, the delay elements introduce delays in the range from approximately 5% to approximately 25% of the period of the first signal.

An embodiment provides a circuit for controlling two series-connected MOS transistors, comprising a signal generation circuit such as described.

An embodiment provides a power converter comprising: at least two switches series-connected between two power supply terminals; and a signal generation circuit such as described, said second and third signals respectively controlling the switches.

According to an embodiment, the switches respectively are a P-channel MOS transistor and an N-channel MOS transistor.

According to an embodiment, a junction point of the two switches is coupled to an indicative element.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the applications of the switched-mode power supplies controlled from the described circuit have not been detailed, the described embodiments being compatible with usual applications. Similarly, the generation of the pulse-width modulated signal to which the described circuit is applied, based on regulation control signals or others, has not been detailed, the described embodiments being here again compatible with usual circuits (microcontroller or other) of generation of such signals.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", and "approximately" are used herein to designate a tolerance of plus or minus 10%, preferably of plus or minus 5%, of the value in question.

Reference is more particularly made to an application to the generation of non-overlapping signals to control a CMOS circuit of control of a power switch of a switched mode power supply. However, all that is described more generally applies to any application where two non-overlapping signals are desired to be generated from a same digital signal.

Figure 1:
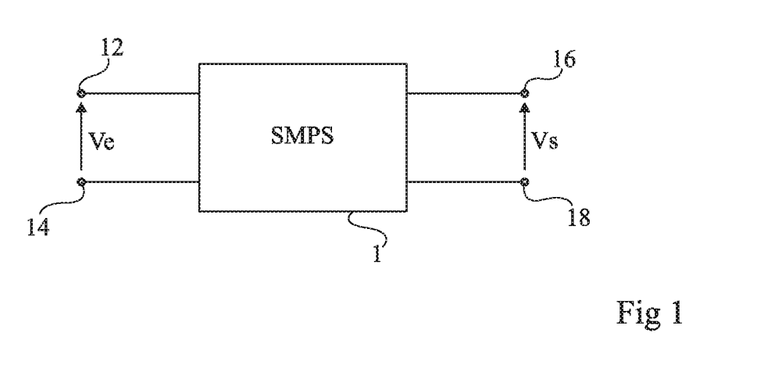
FIG. 1 very schematically shows in the form of blocks an example of a switched-mode power supply of the type to which the described embodiments apply.

FIG. 1 very schematically shows, in the form of blocks, an example of a switched-mode power supply of the type to which the described embodiments apply.

A switched-mode power supply (SMPS), symbolized in FIG. 1 by a block 1, is an element of a power converter and has the function of converting an input voltage Ve (DC or AC), applied between two input terminals 12 and 14, into an output voltage Vs (DC or AC), supplied between two output terminals 16 and 18. Its operation is based on the switching of one or a plurality of power switches.

Figure 2:
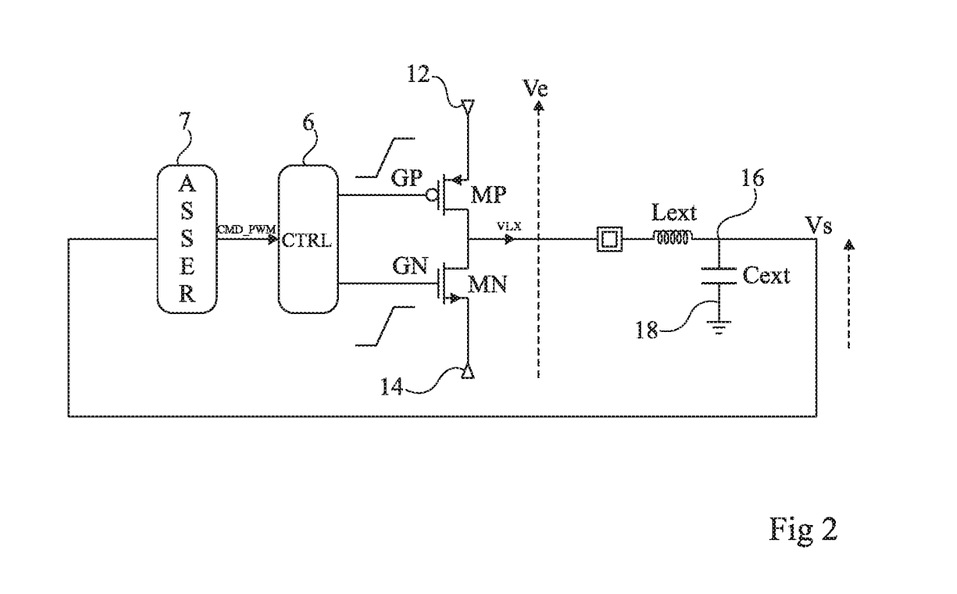
FIG. 2 very schematically and partially shows an example of a switched-mode power supply circuit.

FIG. 2 very schematically and partially shows an example of a voltage step-down switched-mode power supply circuit.

The circuit of FIG. 2 is based on an inductance Lext and two power switches MP and MN switching an input voltage Ve on inductance Lext, thus generating a current through inductance Lext, in average equal to the output current. A capacitor Cext coupling terminal 16 to ground 18 turns the current into an output voltage Vs. The value of voltage Vs is determined by the times of conduction of power switches MP and MN, which times are themselves determined by the pulse-width modulation.

Transistors MP and MN are controlled by a circuit 6 (CTRL), in pulse-width modulation. Circuit 6 generates digital signals (i.e., signals having two logic states associated with two different voltages; for example a positive voltage and a ground voltage, for all (turn on) or nothing (turn off) control) to be applied to the respective gates of transistors MP and MN. Circuit 6 receives a digital pulse signal CMD_PWM and generates, from signal CMD_PWM, two non-overlapping digital signals GP and GN of control of respective transistors MP and MN. Signal CMD_PWM is generally generated by a servo-control circuit 7 (ASSER) taking into account information representative of output voltage Vs.

It is important for signals GP and GN not to overlap to avoid a simultaneous conduction of transistors MP and MN (i.e., both of the two transistors MP and MN are on), which would short-circuit the input voltage source. The state in which both of the two transistors MP and MN are off is however allowed.

Figure 3:
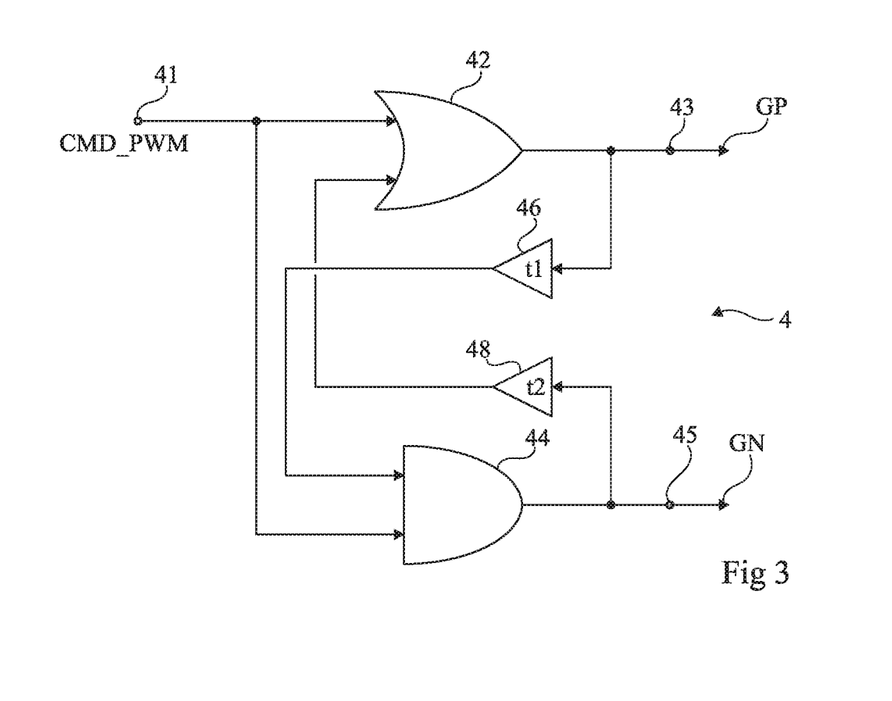
FIG. 3 very schematically shows an example of a circuit for generating non-overlapping signals.

FIG. 3 very schematically shows an example of a circuit 4 of generation of non-overlapping signals.

Circuit 4 is a logic circuit, based on logic gates and on delay elements.

Circuit 4 comprises an input terminal 41, configured to receive signal CMD_PWM controlling the cutting off of voltage Ve and two output terminals 43 and 45, configured to respectively deliver signals GP and GN for controlling the gate of transistors MP and MN.

Circuit 4 comprises a first OR-type logic function, for example, an OR gate 42, with two inputs. A first input of gate 42 is coupled, preferably connected, to terminal 41 and thus receives signal CMD_PWM. The output of gate 42 is coupled, preferably connected, to terminal 43 and delivers signal GP. Circuit 4 also comprises a second AND type logic function, for example, an AND gate 44, with two inputs. A first input of gate 44 is coupled, preferably connected, to terminal 41 and thus receives signal CMD_PWM. The output of gate 44 is coupled, preferably connected, to terminal 45 and delivers signal GN. The output of gate 42 is further coupled, via a delay element 46 (t1), to the second input of AND gate 44. The output of gate 44 is further coupled, via a delay element 48 (t2), to the second input of gate 42.

Delay elements 46 and 48 are, for example, series connected inverters, possible associated with capacitive elements. Delay elements 46 and 48 introduce delays, respectively t1 and t2, having durations which may be different from each other. Delays t1 and t2 are longer than the times of propagation through gates 42 and 44. They are sized according to the application and particularly according to the frequency of signal CMD_PWM.

Circuit 4 operates as follows. Assuming an initial state where the two signals GP and GN are in the low state (that is, transistor MP is on and transistor MN is off), a rising edge of signal CMD_PWM results in a rise of signal GP (the two inputs of gate 42 result being in the high state). Transistor MP turns off. As long as the high state of signal GP has not reached gate 44, the output of gate 44 remains in the low state (signal GN) and transistor MN remains off. Then, at the end of delay t1, gate 44 switches and signal GN switches to the high state, turning on transistor MN. At the end of delay t2, a high state reaches the second input of gate 42, thus locking, in a way, the turning off of transistor MP. When signal CMD_PWM falls back, this causes the switching of gate 44, which switches signal GN to the low state and turns off transistor MN. At the end of delay t2, gate 42 switches to the low state (its two inputs are in the low state), which turns on transistor MP. Then, at the end of delay t1, a low state reaches the second input of gate 44, locking, in a way, the turning off of transistor MN.

This operation guarantees that signals GP and GN do not overlap as long as the duty cycle of signal CMD_PWN is not too distant from 50%. However, if the width of the pulse (high state) of signal CMD_PWM becomes smaller than the sum of delays t1 and t2, a simultaneous conduction of transistors MP and MN inevitably occurs.

Figure 4:
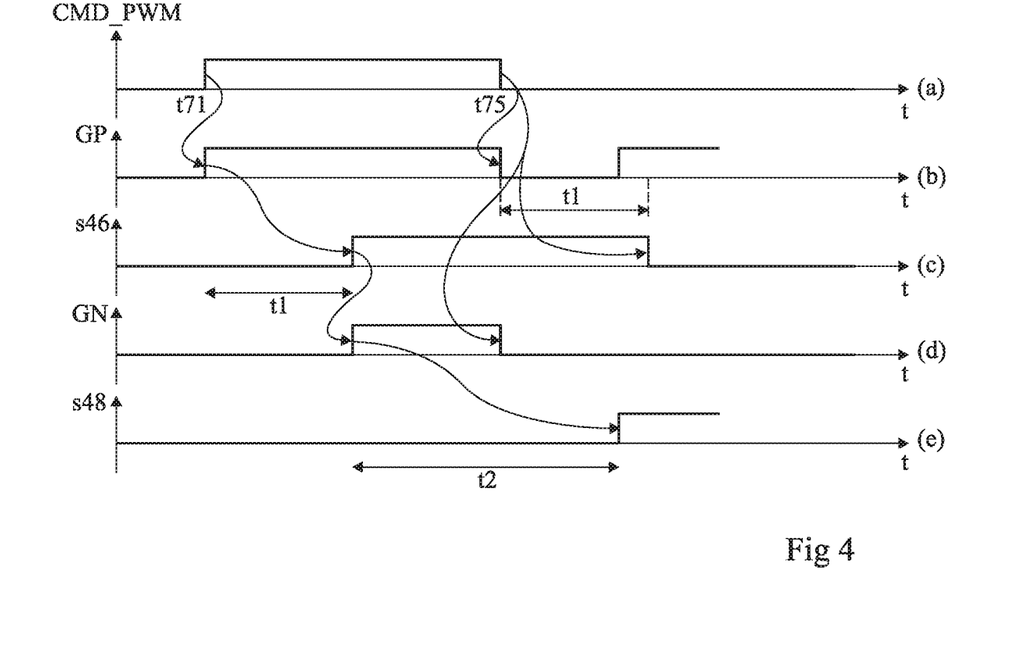
FIG. 4 illustrates in timing diagrams an example of operation of the circuit of FIG. 3.

FIG. 4 illustrates, in timing diagrams (a), (b), (c), (d), and (e), an example of operation of the circuit of FIG. 3, where such a simultaneous conduction occurs.

FIG. 4 shows five timing diagrams (a), (b), (c), (d), and (e) respectively illustrating an example of signal CMD_PWM (a) and the corresponding shapes of signal GP (b), of output signal s46 of delay element 46 (c), of signal GN (d), and of output signal s48 of delay element 48 (e).

For simplification, the propagation times in the logic gates, which, in practice, are negligible as compared with delays t1 and t2 (and thus with the period of signal CMD_PWM), are neglected in the timing diagrams of FIG. 4 (and in all the timing diagrams of the drawings).

As previously, an initial state where all the signals are in the low state (transistor MP on and transistor MN off) is considered. It is assumed that signal CMD_PWM switches to the high state. Signal GP then switches to the high state, which turns off transistor MP (transistor MN being off at this time) at a time t71. At the end of delay t1, signal s46 switches to the high state, which causes the switching of signal GN and the turning on of transistor MN.

It is then assumed that the sum of delays t1 and t2 is greater than the duration of the positive pulse of signal CMD_PWM, and that at a time t75, signal CMD_PWM falls back while output s48 has not switched to the high state yet. Control signal CMD_PWM wants to turn on transistor MP, which effectively occurs. However, at this time t75, a simultaneous conduction of transistors MP and MN occurs since signals GP and GN both switch to the low state (the two inputs of gate 42 are in the low state and one of the inputs of gate 44 is in the low state). Signal s48 effectively switches to the high state at the end of delay t2, but it is too late. Further, at the end of delay t2 (it is assumed in FIG. 4 that this time occurs before the end of the second delay t1 initiated by time t75), the output of gate 42 switches back to the high state, which then causes the turning off of transistor MP while control signal CMD_PWM has not changed. Even if second delay t1 ends before the end of delay t2, an unwanted turning back off of transistor MP occurs. Thus, not only does a simultaneous conduction of transistors MP and MN occur, but also is the behavior of the switching no longer in accordance with the control signal.

It should be noted that, whatever the sizing of delays t1 and t2, in the circuit of FIG. 3, this problem arises if it is desired to operate with the entire possible range of the duty cycles of signal CMD_PWM.

Figure 5:
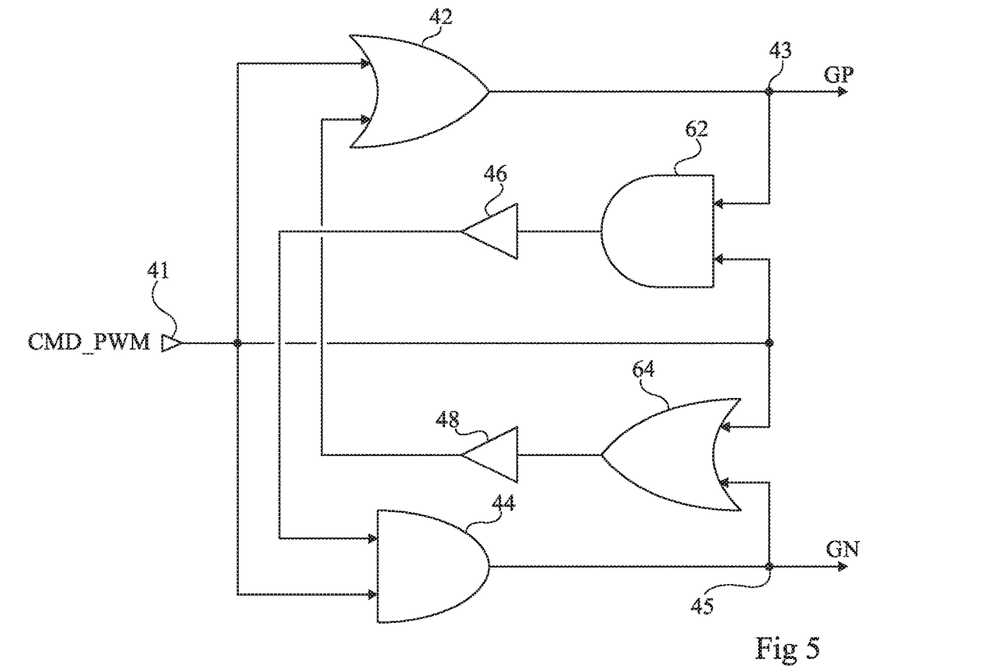
FIG. 5 very schematically shows an embodiment of a circuit for generating non-overlapping signals.

FIG. 5 very schematically shows an embodiment of a circuit 6 for generating non-overlapping circuits.

It shows the OR and AND logic functions of FIG. 3, carried out by gates 42 and 44 having first respective inputs coupled, preferably connected, to input terminal 41 of circuit 6, as well as two delay elements 46 and 48 having their outputs respectively coupled, preferably connected, to the second inputs of gates 44 and 42.

According to the embodiment of FIG. 5, the input of delay element 46 is coupled, preferably connected, to the output of an AND-type logic function, for example, a two input AND gate 62, combining the respective states of signals GP and CMD_PWM. A first input of gate 62 is thus coupled, preferably connected, to terminal 41 and a second input of gate 62 is coupled, preferably connected, to terminal 43. Further, the input of delay element 48 is coupled, preferably connected, to the output of an OR-type logic function, for example, a two-input logic OR gate 64, combining the respective states of signals GN and CMD_PWM. A first input of gate 64 is thus coupled, preferably connected, to terminal 41 and a second input of gate 64 is coupled, preferably connected, to terminal 45.

Figure 6:
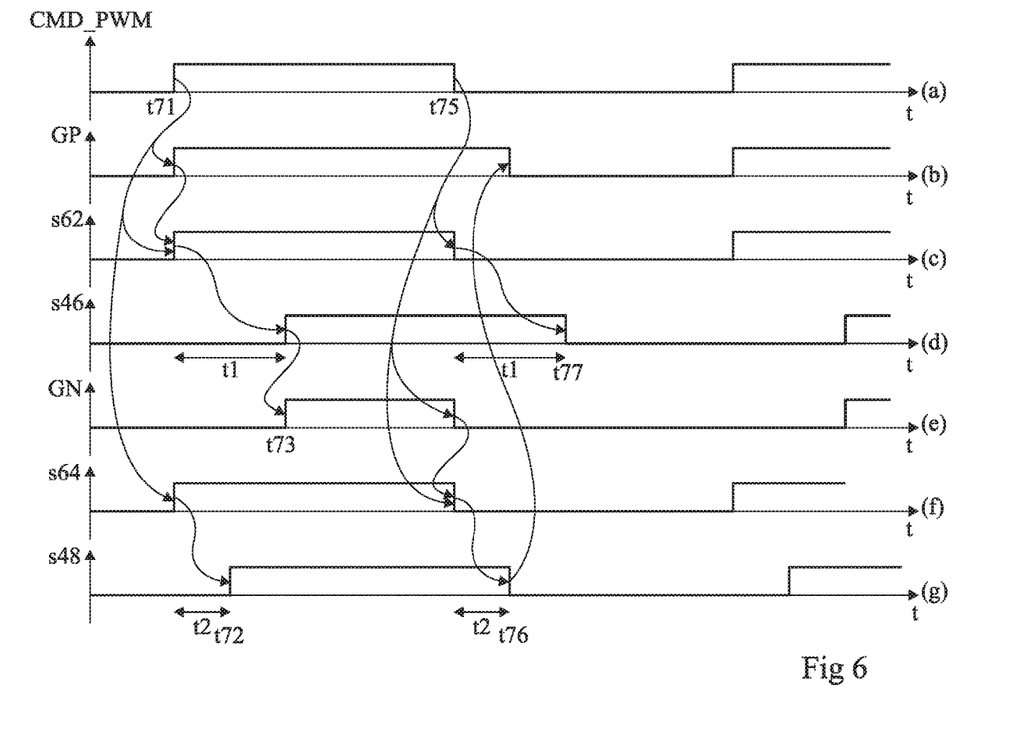
FIG. 6 illustrates in timing diagrams an example of operation of the circuit of FIG. 5.

FIG. 6 illustrates, in timing diagrams, an example of operation of the circuit of FIG. 5.

FIG. 6 shows seven timing diagrams (a), (b), (c), (d), (e), (f), and (g) respectively illustrating an example of signal CMD_PWM (a) and the corresponding shapes of signal GP (b), of output signal s62 of gate 62 (c), of signal s46 of delay element 46 (d), of signal GN (e), of output signal s64 of gate 64 (f), and of output signal s48 of delay element 48 (g).

In the example of FIG. 6, a duty cycle of signal CMD_PWM in the order of 50%, a delay t1 longer than delay t2, and a sum of delays t1 and t2 shorter than the duration of a pulse of signal CMD_PWM are assumed.

An initial state where all the signals are in the low state, transistor MP being on and transistor MN being off, is assumed.

When signal CMD_PWM switches to the high state (time 71), this results in a rise of signal GP (the two inputs of gate 42 are in the high state). Transistor MP turns off. The outputs of gates 62 and 64 also switch to the high state (signals CMD_PWM and GP are in the high state). As long as the high state of signal s62 has not reached gate 44, the output of gate 44 remains in the low state (signal GN) and transistor MN remains off.

At the end of delay t2 (time 72), a high state reaches the second input of gate 42, thus locking, in a way, the turning off of transistor MP. Then, at the end of delay t1 (time t73), gate 44 switches and signal GN rises to the high state, thus turning on transistor MN. The output of gate s64 remains in the high state since signal CMD_PWM still is in the high state. This state is maintained as long as signal CMD_PWM remains in the high state.

When signal CMD_PWM falls back (time t75), this causes the switching of gate 44, which switches signal GN to the low state and turns off transistor MN. At the same time, signal s62 switches to the low state, as well as signal s64. At the end of the (second) delay t2 (time t76) initiated by time t75, gate 42 switches to the low state (its two inputs are in the low state), which causes the switching to the low state of signal GP and turns on transistor MP. Then, at the end of the (second) delay t1 (time t77) initiated by time t75, a low state reaches the second input of gate 44, locking, in a way, the turning off of transistor MN.

Figure 7:
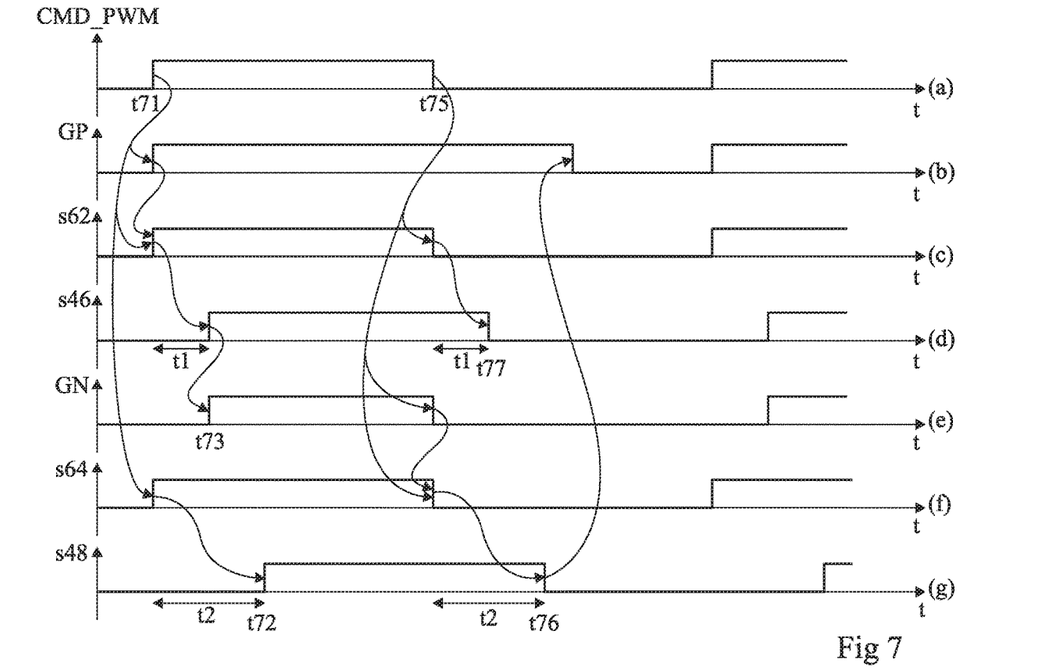
FIG. 7 illustrates in timing diagrams another example of operation of the circuit of FIG. 5.

FIG. 7 illustrates, in timing diagrams, another example of operation of the circuit of FIG. 5.

FIG. 7 shows seven timing diagrams (a), (b), (c), (d), (e), (f), and (g) respectively illustrating an example of signal CMD_PWM (a) and the corresponding shapes of signal GP (b), of output signal s62 of gate 62 (c), of signal s46 of delay element 46 (c), of signal GN (e), of output signal s64 of gate 64 (f), and of output signal s48 of delay element 48 (g).

In the example of FIG. 7, a low duty cycle of signal CMD_PWM, such that the duration of the pulse (in the high state) of signal CMD_PWM is shorter than delay t1, and thus than the sum of delays t1 and t2 (case of FIG. 4), is assumed. The case of FIG. 6 with a delay t1 greater than delay t2 is further assumed.

As previously, an initial state where all the signals are in the low state, transistor MP being on and transistor MN being off, is assumed.

When signal CMD_PWM switches to the high state (time 71), this results, as in FIG. 6, in a rise of signals GP (transistor MP turns off), s62, and s64.

It is considered in FIG. 7 that the duration of pulse CMD_PWM is longer than the duration of delay t2. Accordingly, time t72 is the first time which follows time t71. At time t72 (end of delay t2), a high state reaches the second input of gate 42, thus locking, in a way, the turning off of transistor MP.

Then, the pulse disappears (time t75) before the end of delay t1. This results in the fact that signals s62 and s64 fall back to the low state (while signal GN has not risen yet since delay t1 has not ended). Signal GP remains in the high state since signal s48 has not fallen back yet.

It is assumed in FIG. 7 that the ratio of delays t1 and t2 is such that the next time is time t73 of end of delay t1, initiated by time t71, rather than time t76 of end of delay t2, initiated by time t75. At time t73, signal s46 then switches to the high state. This however does not change the state of signal GN, which remains in the low state since the pulse of signal CMD_PWM has already disappeared. Then, at time t76, signal s48 falls back. This causes the switching to the low state of signal GP, and thus the turning on of transistor MP. The pulse on signal s46 disappears at time t77 without for this to impact the other signals.

It should be noted that if, conversely, the ratio of delays t1 and t2 is such that time t76 occurs before time t73, the pulse of signal S48 disappears before the pulse of signal s46 appears. The consequence is that signal GP falls back before time t73, but this is of no importance since signal GN still is in the low state.

Figure 8:
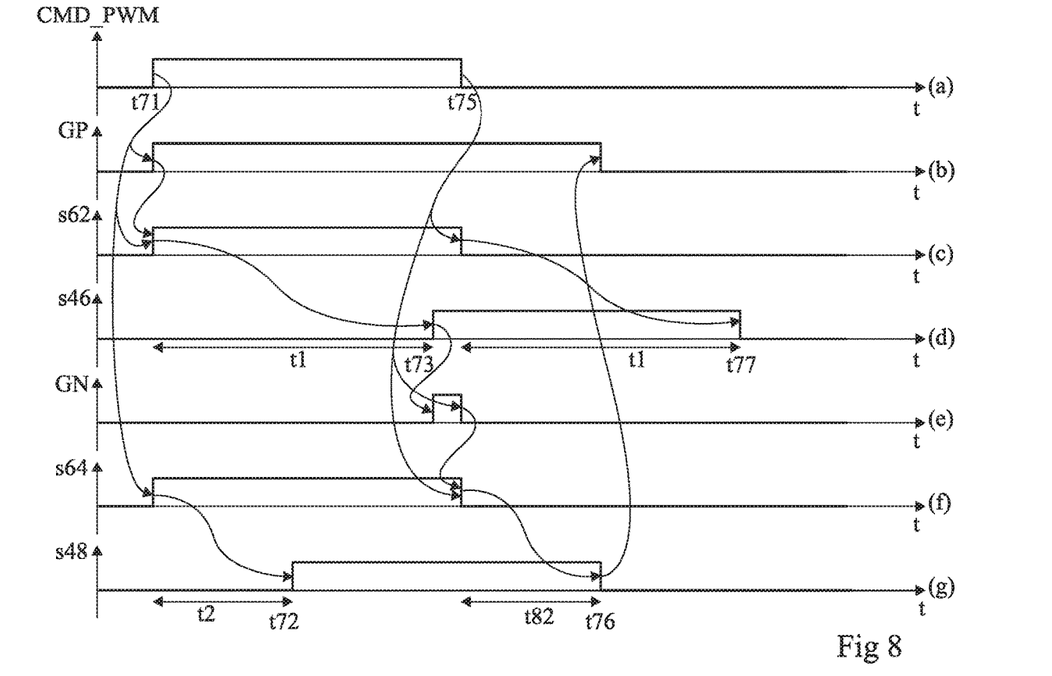
FIG. 8 illustrates in timing diagrams still another example of operation of the circuit of FIG. 5.

FIG. 8 illustrates, in timing diagrams, still another example of operation of the circuit of FIG. 5.

FIG. 8 shows seven timing diagrams (a), (b), (c), (d), (e), (f), and (g) respectively illustrating an example of signal CMD_PWM (a) and the corresponding shapes of signal GP (b), of output signal s62 of gate 62 (c), of signal s46 of delay element 46 (d), of signal GN (e), of output signal s64 of gate 64 (f), and of output signal s48 of delay element 48 (g).

In the example of FIG. 8, a situation where the duty cycle of signal CMD_PWM is such that the duration of the pulses of signal CMD_PWM is shorter than the sum of delays t1 and t2 but longer than each delay t1 or t2 is assumed. The case where delay t1 is longer than delay t2 is further considered.

As previously, an initial state where all the signals are in the low state is assumed, transistor MP being on and transistor MN being off.

The operation at the rising edge of signal CMD_PWM is identical to that discussed in relation with FIG. 7. Thus, after time t72, signals GP, s62, s64, and s48 are in the high state and signals s46 and GN are in the low state.

The next time is time t73 of end of delay t1. At time t73, signal GN switches to the high state, which turns on transistor MN. Transistor MP is still blocked by the pulse of signal CM_PWM. One thus is, at time t73, in the stable situation where all the signals are in the high state until the falling edge of signal CMD_PWM (case of FIGS. 6 and 7).

The operation at this falling edge (time t75) of signal CMD_PWM is identical to that discussed in relation with FIG. 6.

It should be noted that a similar operation occurs if the ratio of delays t1 and t2 is inverted (delay t1 is shorter than delay t2 and each delay is shorter than the duration of a pulse of signal CMD_PWM, but the sum of the delays is longer than the duration of the pulses of signal CMD_PWM). The only difference is that the turning on of transistor MN (time t73) occurs sooner and before time t72, which locks the turning off of transistor MP. The occurrence (time t75) of the end of the pulse of signal CMD_PWM still causes the turning off of transistor MN while the turning off of transistor MP only occurs at the end of delay t2. The switching to the low state of signal s46 at the end of delay t1 is of no effect since signal CMD_PWM has already fallen back.

It can be seen from the above drawings that with extreme duty cycles on the short pulse duration side, any simultaneous conduction is avoided, whatever the ratio of delays t1 and t2 and their duration with respect to that of the pulse of signal CMD_PWM.

Figure 9:
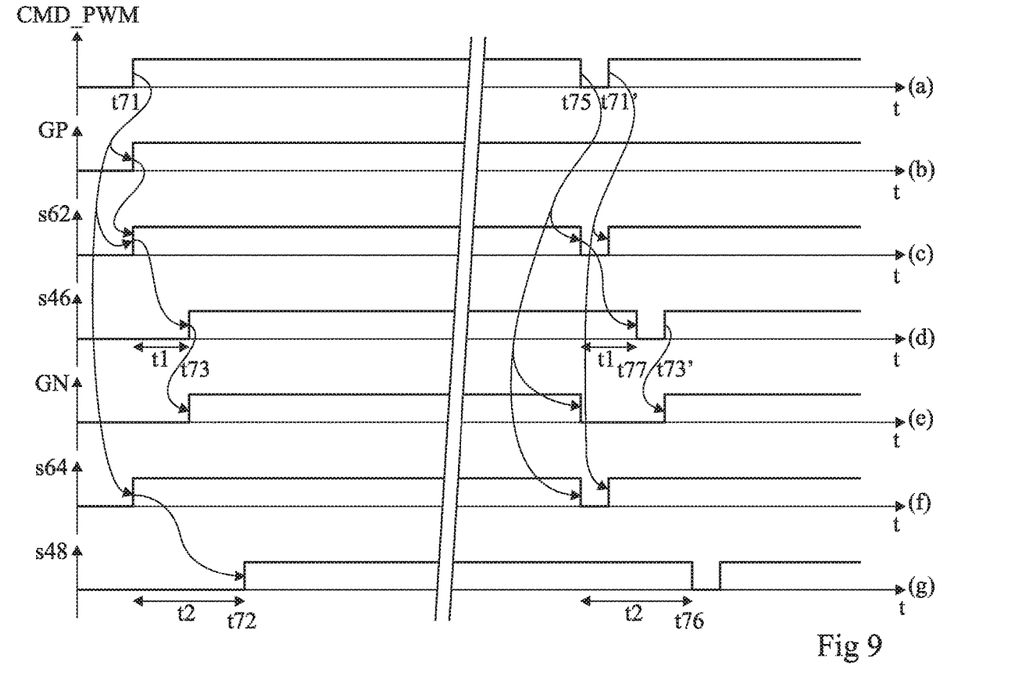
FIG. 9 illustrates in timing diagrams still another embodiment of the circuit of FIG. 5.

FIG. 9 illustrates, in timing diagrams, another example of operation of the circuit of FIG. 5.

FIG. 9 shows seven timing diagrams (a), (b), (c), (d), (e), (f), and (g) respectively illustrating an example of signal CMD_PWM (a) and the corresponding shapes of signal GP (b), of output signal s62 of gate 62 (c), of signal s46 of delay element 46 (d), of signal GN (e), of output signal s64 of gate 64 (f), and of output signal s48 of delay element 48 (g).

In the example of FIG. 9, a large duty cycle of signal CMD_PWM, such that the duration of the interval between two pulses (in the high state) of signal CMD_PWM is shorter than delay t1 and delay t2, and thus to the sum of delays t1 and t2, is assumed. The case where delay t1 is shorter than delay t2 is further considered.

As previously, an initial state where all the signals are in the low state is assumed, transistor MP being on and transistor MN being off.

The operation at the rising edge of signal CMD_PWM is identical to that discussed in relation with FIG. 7. Thus, after time t72, all the signals are in the high state.

At time t75 when pulse CMD_PWM disappears, signals s62, GN, and s64 switch to the low state. Transistor MN is thus off. Transistor MP remains off under the effect of signal s48, which is still in the high state. At the next time t71', which corresponds to the occurrence of the next pulse of signal CMD_PWM, signals s62 and s64 switch back to the high state (signal GP being still in the high state since the delay t2 initiated by time t75 has not ended). At time t77, the delay t1 initiated by time t75 end and signal s46 switches to the low state. Nothing happens since signal GN is in the low state. Only at the next time t73' (end of delay t1 initiated by time t71') is transistor MN turned back on. The end of delay t2 at time t76 has no effect since signal CMD_PWM is already in the high state.

It should be noted that with an inverse ratio of delays t1 and t2 (delay t2 shorter than delay t1), the only consequence is that signal s48 switches to the low state before transistor MN is turned back on, but this has no incidence.

Thus, for extreme duty cycles on the long pulse duration side, any simultaneous conduction is avoided, whatever the ratio of delays t1 and t2.

An advantage of the described embodiments is that they guarantee a lack of overlapping of the generated control signals of transistors MP and MN, whatever the duty cycle of the input signal, the ratio of the delays introduced by elements 46 and 48, and the relations between the duty cycle and the durations of the delays. The only possible consequence is that with extreme duty cycles towards low values or towards high values, the duration of the pulse (low values) or the interval between two pulses (high values) is not respected. However, this is not disturbing in practice since this is already an extreme situation where what matter is to avoid the simultaneous conduction but where the conduction periods of transistor MN (small duty cycle) or of transistor MP (high duty cycle) are anyways, according to the control signal, negligible as compared with the conduction periods of the other transistor. The only constraint to be respected is for each delay t1, t2 to be longer than the propagation time in that of gates 42, 44, 62, 64 which has the longest propagation time. In particular, although delays t1 and t2 different from each other have been taken as an example, they may be identical.

As a specific embodiment, delays t1 and t2 in the range from approximately 5% to approximately 25% of the period of pulse-width modulation control signal CMD_PWM, preferably in the order of 10% for one, preferably t1, and in the order of 20% for the other, preferably t2, are provided.

Another advantage of the described embodiments is that they require no modification of control signal CMD_PWM. Thus, the described embodiments are compatible with existing control architectures.

Another advantage of the described embodiments is that they are particularly simple to form and, for example, to integrate as an input stage of a CMOS control circuit (driver).

Various embodiments and variations have been described. It will be understood by those skilled in the art that certain features of these various embodiments and variations may be combined, and other variations will occur to those skilled in the art.

Finally, the practical implementation of the described embodiments and variations is within the abilities of those skilled in the art based on the functional indications given hereabove. In particular, the selection of the delays introduced by inverters 46 and 48 is within the abilities of those skilled in the art according to the application and to the provided functional indications.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A circuit including a signal generation circuit configured to generate a first digital signal and a second digital signal from an input pulse signal, wherein the first and second digital signals are non-overlapping, the signal generation circuit comprising:
   a first digital circuit comprising:
      a first logical combination of the second digital signal and the input pulse signal to generate a third digital signal; and
      a second logical combination of the input pulse signal and the third digital signal to generate the first digital signal; and
   a second digital circuit comprising:
      a third logical combination of the first digital signal and the input pulse signal to generate a fourth digital signal; and
      a fourth logical combination of the input pulse signal and the fourth digital signal to generate the second digital signal.

2. The circuit of claim 1, wherein the first logical combination is implemented by a logic OR gate and the second logical combination is implemented by a logic OR gate.

3. The circuit of claim 1, wherein the first digital circuit further comprises a delay circuit configured to delay the third digital signal.

4. The circuit of claim 3, wherein the delay circuit is configured to introduce a signal delays in a range from approximately 5% to approximately 25% of a period of the input pulse signal.

5. The circuit of claim 1, wherein the third logical combination is implemented by a logic AND gate and the fourth logical combination is implemented by a logic AND gate.

6. The circuit of claim 1, wherein the second digital circuit further comprises a delay circuit configured to delay the fourth digital signal.

7. The circuit of claim 6, wherein the delay circuit is configured to introduce a signal delays in a range from approximately 5% to approximately 25% of a period of the input pulse signal.

8. The circuit of claim 1, wherein the input pulse signal is a pulse-width modulated signal.

9. The circuit of claim 1, further comprising:
   a first MOS transistor having a control terminal driven by the first digital signal; and
   a second MOS transistor having a control terminal driven by the second digital signal;
   wherein the first and second MOS transistors are coupled in series at an intermediate node.

10. The circuit of claim 9, further comprising an inductor having a first terminal coupled to the intermediate node and a second terminal coupled to an output node.

11. The circuit of claim 10, wherein the first MOS transistor is a P-channel MOS transistor and wherein the second MOS transistor is an N-channel MOS transistor.

12. A circuit, comprising:
   a first terminal configured to receive an input pulse signal;
   a first OR-type logic function having a first input coupled to the first terminal and having an output coupled to a second terminal configured to supply a first digital signal;
   a first AND-type logic function having a first input coupled to the first terminal and having an output coupled to a third terminal configured to supply a second digital signal;
   a second AND-type logic function having a first input coupled to the first terminal, having a second input coupled to the second terminal, and having an output coupled, via a first delay element, to a second input of the first AND-type logic function; and
   a second OR-type logic function having a first input coupled to the first terminal, having a second input coupled to the third terminal and having an output coupled, via a second delay element, to a second input of the first OR-type logic function.

13. The circuit of claim 12, wherein each of the first and second delay elements is configured to introduce a signal delay in a range from approximately 5% to approximately 25% of a period of the input pulse signal.

14. The circuit of claim 12, wherein the input pulse signal is a pulse-width modulated signal.

15. The circuit of claim 12, further comprising:
   a first MOS transistor having a control terminal driven by the first digital signal; and
   a second MOS transistor having a control terminal driven by the second digital signal;
   wherein the first and second MOS transistors are coupled in series at an intermediate node.

16. The circuit of claim 15, further comprising an inductor having a first terminal coupled to the intermediate node and a second terminal coupled to an output node.

17. The circuit of claim 16, wherein the first MOS transistor is a P-channel MOS transistor and wherein the second MOS transistor is an N-channel MOS transistor.

18. A circuit including a signal generation circuit configured to generate a first digital signal and a second digital signal from an input pulse signal, wherein the first and second digital signals are non-overlapping, the signal generation circuit comprising:
   a first logic OR-type function configured to supply the first digital signal in response to the input pulse signal and delayed information from a first logical combination of the second digital signal and the input pulse signal; and
   a first logic AND-type function configured to supply the second digital signal in response to the input pulse signal and delayed information from a second logical combination of the first digital signal and the input pulse signal.

19. The circuit of claim 18:
   wherein the first logical combination comprises a second OR-type logic function receiving the second digital signal and the input pulse signal; and
   wherein the second logical combination comprises a second AND-type logic function receiving the first digital signal and the input pulse signal.

20. The circuit of claim 18, wherein the delayed information includes a signal delay in a range from approximately 5% to approximately 25% of a period of the input pulse signal.

21. The circuit of claim 18, wherein the input pulse signal is a pulse-width modulated signal.

22. The circuit of claim 18, further comprising:
   a first MOS transistor having a control terminal driven by the first digital signal; and
   a second MOS transistor having a control terminal driven by the second digital signal;
   wherein the first and second MOS transistors are coupled in series at an intermediate node.

23. The circuit of claim 22, further comprising an inductor having a first terminal coupled to the intermediate node and a second terminal coupled to an output node.

24. The circuit of claim 23, wherein the first MOS transistor is a P-channel MOS transistor and wherein the second MOS transistor is an N-channel MOS transistor.

25. A circuit including a signal generation circuit configured to generate a first digital signal and a second digital signal from an input pulse signal, wherein the first and second digital signals are non-overlapping, the signal generation circuit comprising:
   a first logic OR-type function configured to supply the first digital signal in response to the input pulse signal and a first delayed signal generated from a first logical combination of the second digital signal and the input pulse signal; and
   a first logic AND-type function configured to supply the second digital signal in response to the input pulse signal and a second delayed signal generated from a second logical combination of the first digital signal and the input pulse signal;
   wherein the first delayed signal is generated by applying a first signal delay in a range from approximately 5% to approximately 25% of a period of the input pulse signal; and
   wherein the second delayed signal is generated by applying a second signal delay in a range from approximately 5% to approximately 25% of the period of the input pulse signal.

26. The circuit of claim 25:
   wherein the first logical combination comprises a second OR-type logic function receiving the second digital signal and the input pulse signal; and
   wherein the second logical combination comprises a second AND-type logic function receiving the first digital signal and the input pulse signal.

27. The circuit of claim 25, wherein the input pulse signal is a pulse-width modulated signal.

28. The circuit of claim 25, further comprising:
   a first MOS transistor having a control terminal driven by the first digital signal; and
   a second MOS transistor having a control terminal driven by the second digital signal;
   wherein the first and second MOS transistors are coupled in series at an intermediate node.

29. The circuit of claim 28, further comprising an inductor having a first terminal coupled to the intermediate node and a second terminal coupled to an output node.

30. The circuit of claim 29, wherein the first MOS transistor is a P-channel MOS transistor and wherein the second MOS transistor is an N-channel MOS transistor.

* * * * *